(12) United States Patent
Kulkarni et al.

(10) Patent No.: US 11,741,006 B1
(45) Date of Patent: *Aug. 29, 2023

(54) CONFIGURATION MAPPING USING A MULTI-DIMENSIONAL RULE SPACE AND RULE CONSOLIDATION

(71) Applicant: Trilogy Intellectual Property Holdings, Inc., Austin, TX (US)

(72) Inventors: Aditya P. Kulkarni, Bangalore (IN); Sourabh Kukreja, Jabalpur (IN)

(73) Assignee: Trilogy Intellectual Property Holdings, Inc., Austin, TX (US)

( * ) Notice: Subject to any disclaimer, the term of this patent is extended or adjusted under 35 U.S.C. 154(b) by 735 days.

This patent is subject to a terminal disclaimer.

(21) Appl. No.: 16/692,014

(22) Filed: Nov. 22, 2019

Related U.S. Application Data

(63) Continuation of application No. 15/174,480, filed on Jun. 6, 2016, now Pat. No. 10,488,844, which is a continuation of application No. 13/743,269, filed on Jan. 16, 2013, now Pat. No. 9,390,009, which is a (Continued)

(51) Int. Cl.
| | |
|---|---|
| *G06Q 10/06* | (2023.01) |
| *G06F 12/06* | (2006.01) |
| *G05B 19/4097* | (2006.01) |
| *G06F 30/00* | (2020.01) |
| *G06N 5/04* | (2023.01) |
| *G06N 5/025* | (2023.01) |
| *G06N 5/022* | (2023.01) |

(52) U.S. Cl.
CPC ........ *G06F 12/0646* (2013.01); *G05B 19/4097* (2013.01); *G06F 30/00* (2020.01); *G06Q 10/06* (2013.01); *G05B 2219/35061* (2013.01); *G06N 5/022* (2013.01); *G06N 5/025* (2013.01); *G06N 5/04* (2013.01)

(58) Field of Classification Search
None
See application file for complete search history.

(56) References Cited

U.S. PATENT DOCUMENTS

2002/0188556 A1* 12/2002 Colica et al. .......... G06Q 40/08
705/38

FOREIGN PATENT DOCUMENTS

WO 0195162 A1* 12/2001 ............... A01B 79/005

OTHER PUBLICATIONS

Advisory Action dated Dec. 5, 2018, filed in U.S. Appl. No. 15/174,480, pages 1-3.
(Continued)

*Primary Examiner* — Romain Jeanty
(74) *Attorney, Agent, or Firm* — Kent Chambers; Terrile, Cannatti & Chambers, LLP

(57) ABSTRACT

A configuration mapping system and method increase the effectiveness of mapping of information from an established product line to a new product offering. In at least one embodiment, the configuration mapping system herein uses configuration mapping rules to map individual product features and entire configurations from established products to a new product offering. The configuration mapping system also provides a way to appropriately map, for example, demand and sales information for the purpose of demand estimation and sales prediction. Conventionally, mapping can be ineffective because the configuration mapping rules usually focus on one part of the product at a time, and, if applied in isolation, the impact on other parts is missed. The systems and method herein provide a way to integrate configuration mapping rules across feature parts, time periods, and product lines into a unified, holistic view, allowing for new insights.

26 Claims, 4 Drawing Sheets

Related U.S. Application Data

(63) continuation of application No. 13/176,283, filed on Jul. 5, 2011, now Pat. No. 8,364,628, which is a continuation of application No. 11/684,904, filed on Mar. 12, 2007, now Pat. No. 7,987,149.

(60) Provisional application No. 60/780,965, filed on Mar. 10, 2006.

(56) References Cited

OTHER PUBLICATIONS

Final Rejection dated Jun. 1, 2018, filed in U.S. Appl. No. 15/174,480, pages 1-11.
Non-Final Rejection dated Sep. 28, 2017, filed in U.S. Appl. No. 15/174,480, pages 1-13.
Notice of Allowance dated Jul. 17, 2019, filed in U.S. Appl. No. 15/174,480, pages 1-8.
Preliminary Amendment dated Jul. 13, 2016, filed in U.S. Appl. No. 15/174,480, pages 1-3.
Preliminary Amendment dated Jun. 6, 2016, filed in U.S. Appl. No. 15/174,480, pages 1-3.
Request for Continued Examination dated Dec. 18, 2018, filed in U.S. Appl. No. 15/174,480, pages 1-19.
Response after Final Action dated Nov. 1, 2018, filed in U.S. Appl. No. 15/174,480, pages 1-17.
Response to Final Office Action dated Dec. 5, 2018, filed in U.S. Appl. No. 15/174,480, page 1.
Response to Non-Final Office Action dated Jan. 29, 2018, filed in U.S. Appl. No. 15/174,480, pages 1-17.
Terminal Disclaimer dated Jan. 30, 2018, filed in U.S. Appl. No. 15/174,480, pages 1-3.

\* cited by examiner

CONFIGURATION MAPPING USING A MULTI-DIMENSIONAL RULE SPACE AND RULE CONSOLIDATION

CROSS REFERENCE TO RELATED APPLICATION

This application claims the benefit under 35 U.S.C. § 119(e) and 37 C.F.R. § 1.78 of U.S. Provisional Application No. 60/780,965, filed Mar. 10, 2006 and entitled "Configuration Mapping Using a Multi-Dimensional Rule Space and Rule Consolidation". U.S. Provisional Application No. 60/780,965 includes example systems and methods and is incorporated herein by reference in its entirety.

BACKGROUND OF THE INVENTION

Field of the Invention

The present invention relates in general to the field of information processing, and more specifically to a system and method for configuration mapping using a multi-dimensional rule space and rule consolidation.

Description of the Related Art

Product configurators implemented in software use product models to define products. Examples of product configuration and product configuration models are described in (i) U.S. Pat. No. 5,515,524, issued May 7, 1996, entitled "Method and Apparatus for Configuring Systems", inventors John Lynch and David Franke, and assignee Trilogy Development Group of Austin, Texas (referred to herein as the "Lynch Patent") and (ii) U.S. Pat. No. 5,825,651, issued Oct. 20, 1998, entitled "Method and apparatus for maintaining and configuring systems", inventors Neeraj Gupta, Venky Veeraraghavan, and Ajay Agarwal, and assignee Trilogy Development Group, Inc. of Austin, Texas (referred to herein as the "Gupta Patent"). The Lynch Patent and the Gupta Patent are incorporated herein by reference.

Product configuration model data has been used to determine and correlate product demand data with actual products as, for example, described in U.S. Pat. Application Serial No. 10/699,148, entitled "Identifying Quality User Sessions and Determining Product Demand with High Resolution Capabilities", inventor Paul Daniel Karipides, filed date Oct. 31, 2003, and assignee Trilogy Development Group, Inc. of Austin, TX, (referred to herein as "Karipides I") which is herein incorporated by reference. The demand data can be obtained, for example, from web sessions as, for example, described in U.S. Pat. Application No. 10/324,764, inventors Karipides et al., entitled "Generating Contextual User Network Session History in a Dynamic Content Environment", filed Dec. 20, 2002, and assignee Trilogy Development Group, Inc. of Austin, TX, which is herein incorporated by reference.

Configuration models can change over time but still relate to essentially the same product. For example, in the automotive context, an 'old' configuration model could refer to the color "navy blue" and a subsequent configuration model could refer to "midnight blue". Midnight blue is intended as a replacement for navy blue but is essentially the same color. When configuration model changes, it has been conventionally difficult to correlate data, such as product demand data, associated with an 'old' configuration model with a new configuration model.

SUMMARY OF THE INVENTION

In at least one embodiment, a method of using a computer system to map a first set of configuration rules to a second set of configuration rules, wherein each configuration mapping rule includes a set of parts of a product, the first set of configuration rules includes a first configuration rule and the second set of configuration rules includes a second configuration rule, includes accessing, from a first memory, multiple, part-to-part mapping rules. The method further includes combining the multiple, part-to-part mapping rules into a consolidated configuration mapping rule that maps parts in the first configuration rule to parts in the second configuration rule and storing the consolidated configuration mapping rule in a second memory.

In another embodiment of the present invention, a computer system to map a first set of configuration rules to a second set of configuration rules, wherein each configuration mapping rule includes a set of parts of a product, the first set of configuration rules includes a first configuration rule and the second set of configuration rules includes a second configuration rule, includes a processor and a memory, coupled to the processor. The memory includes code stored therein and executable by the processor for accessing multiple, part-to-part mapping rule, combining the multiple, part-to-part mapping rules into a consolidated configuration mapping rule that maps parts in the first configuration rule to parts in the second configuration rule, and storing the consolidated configuration mapping rule.

In a further embodiment of the present invention, a computer program product includes code stored therein to map a first set of configuration rules to a second set of configuration rules, wherein each configuration mapping rule includes a set of parts of a product, the first set of configuration rules includes a first configuration rule and the second set of configuration rules includes a second configuration rule. The code is executable by a processor for accessing multiple, part-to-part mapping rules, combining the multiple, part-to-part mapping rules into a consolidated configuration mapping rule that maps parts in the first configuration rule to parts in the second configuration rule, and storing the consolidated configuration mapping rule.

In another embodiment of the present invention, an apparatus for mapping a first set of configuration rules to a second set of configuration rules, wherein each configuration mapping rule includes a set of parts of a product, the first set of configuration rules includes a first configuration rule and the second set of configuration rules includes a second configuration rule, includes means for accessing, from a first memory, multiple, part-to-part mapping rules. The apparatus further includes means for combining the multiple, part-to-part mapping rules into a consolidated configuration mapping rule that maps parts in the first configuration rule to parts in the second configuration rule and means for storing the consolidated configuration mapping rule in a second memory.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
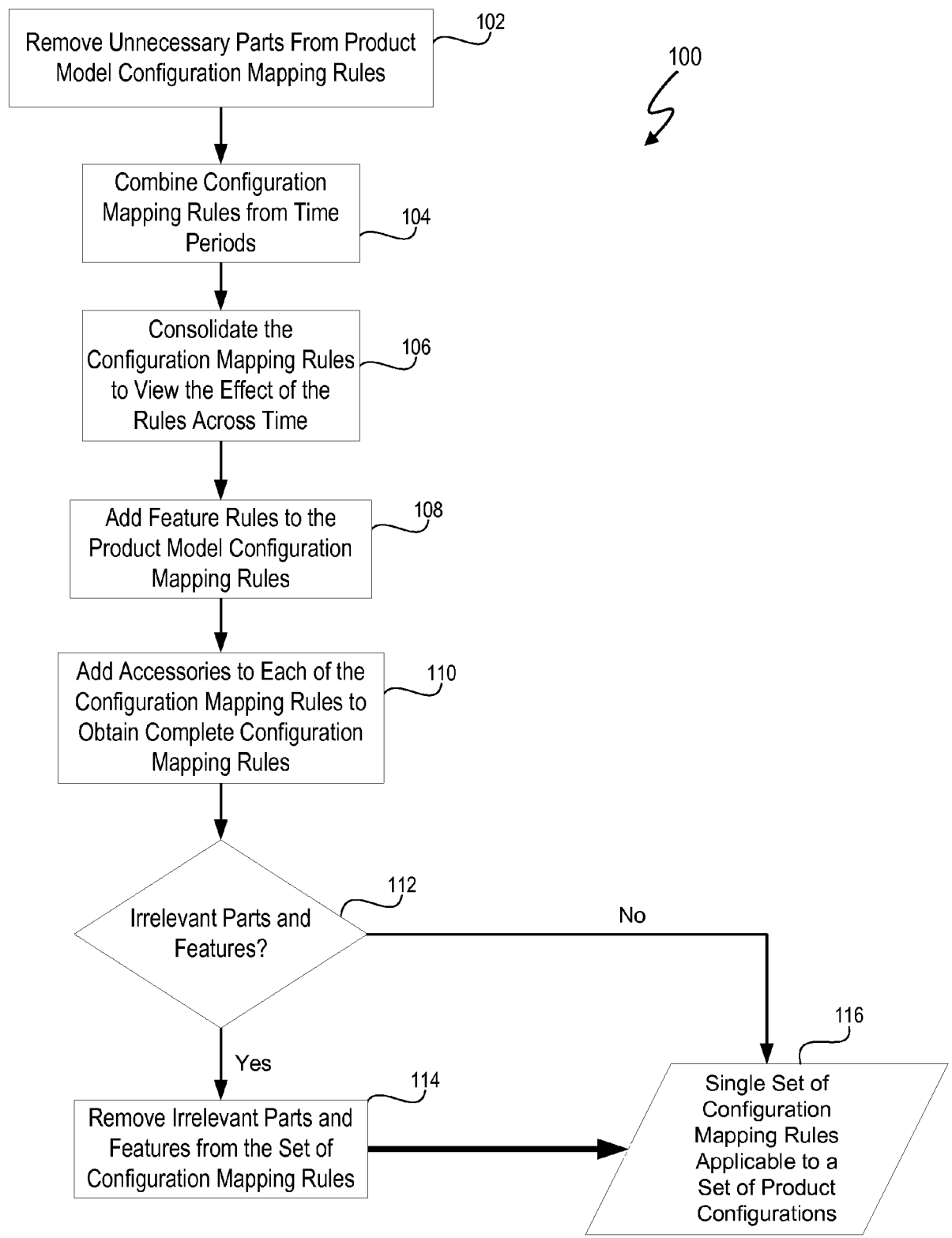
FIG. 1 depicts a configuration mapping process.
Figure 2:
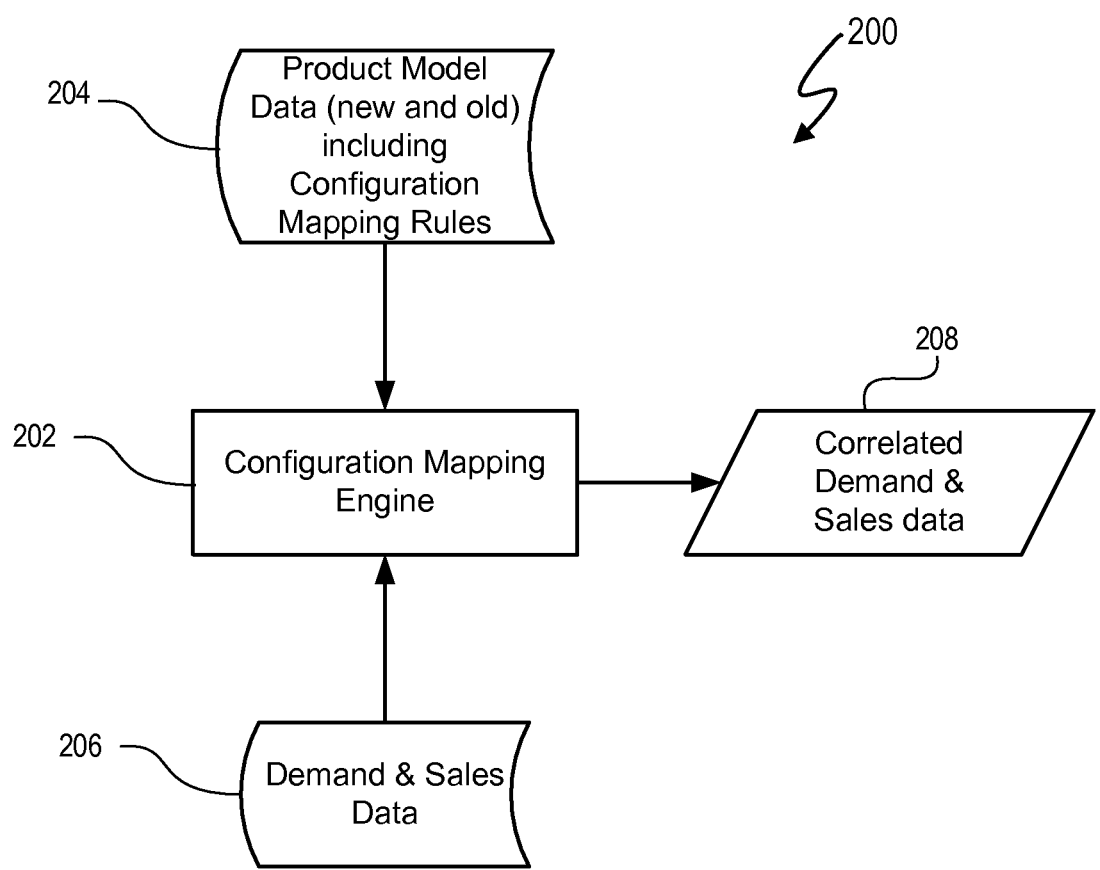
FIG. 2 depicts a configuration mapping system.

Embodiments of the configuration mapping systems and methods described herein increase the effectiveness of mapping of information from an established product line to a new product offering. In at least one embodiment, the configuration mapping system herein uses configuration mapping rules to map individual product features and entire configurations from established products to a new product offering. The configuration mapping system also provides a way to appropriately map, for example, demand and sales information for the purpose of demand estimation and sales prediction. Conventionally, mapping can be ineffective because the mapping rules usually focus on one part of the product at a time, and, if applied in isolation, the impact on other parts is missed. The systems and method herein provide a way to integrate configuration mapping rules across feature aspects, time periods, and product lines into a unified, holistic view, allowing for new insights.

In at least one embodiment, product demand data is correlated with a then-current product definition (i.e. product model). However, product definitions often change. The systems and methods herein can map the changes in the product definition to extend the applicability of the ADI demand data to new product definitions. Karipides I describes exemplary "ADI Demand Data".

Glossary of Selected Terms:

Accessories: Smaller options, such as floor mats.

Config: Config (also referred to as "Configuration") is a valid configuration of parts from which a product, such as a vehicle, can be built. In at least one embodiment, the difference between a Config and a Product Model is that Product Model includes a subset of the features of Config. For example, in at least one embodiment, a Product Model does not include color and Accessories whereas Config does. Config can be represented as:

Config.: Model + Trim + Emission + Transmission + Drive Train + Int Color + Ext Color + Part1 + Part2 + Acc1 + Acc2 + ...., where "Model" represents the Model of the Product, "Trim" represents the Trim of the Product, and so on....

Drive Train: Specifies whether a vehicle is two wheel drive or four wheel drive.

Emission Type: Emission types for specific regions. There are many types of emission codes specific to regions, such as a "50 State Emission" code and a "California Emission" code.

Exterior Color: Exterior color of the Product Model.

Feature: Part.

Interior Color: Interior color of the Product Model.

Model Line: A model line is uniquely identified by the Model name and the model year, such as "Apollo 2004".

Package/Options: Various parts from which a product can be built.

Product Model: Product Model (also referred to as an "End Item Model"). Product models are a combination of parts. Many combination of parts are often possible. For example, a large number of possible parts can be combined into millions of different combinations. In at least one embodiment, the Product Model does not include all parts. For example, in at least one embodiment, the Product Model does not include color and accessories. An example Product Model includes attributes for specific features included in the Product Model. For example, a Product Model can be represented as:

Product Model: Model + Trim + Emission + Transmission + Drive Train + Part1 + Part2 ..., where "Model" represents the Model of the Product, "Trim" represents the Trim of the Product, and so on.

Trim: A complete configuration of a model line catering to a segment of buyers, such as "Apollo 2.5 S".

Transmission: Type of transmission in the model, such as "5 speed Manual Transmission" or "Automatic Transmission".

Configuration Mapping and Configuration Rules. In at least one embodiment, the configuration mapping system and method described herein use configuration mapping rules to map individual product features and entire configurations from established products to a new product offering. In at least one embodiment, the configuration mapping system and method described herein also provide a way to appropriately map demand and sales information for the purpose of demand estimation and sales prediction.

In at least one embodiment, configuration mapping rules are described on a per-part basis. In at least one embodiment, configuration rules represent a relationship between a left hand side part of attribute (LHS) and a right hand side part or attribute (RHS). In at least one embodiment, the relationship in the configuration rules includes "included", "excluded", "removed", and "requires choice". For example, in the context of Trilogy Automotive Demand Intelligence (ADI) described, for example, in Karipides I, configuration mapping rules cover the following parts of a car:

1. Color
2. Packages and Options and Trims
3. Accessories

A part is a single dimensional view of the configuration. So, if the configuration mapping rules are applied in isolation the impact of a part in the presence of other parts is ignored, thus, limiting the predictive value of the mapping. For example, in determining demand for a product, a single rule application might indicate what the demand for a RED car is (color part). Single rule application might even indicate what the demand for a MOONROOF is (accessory part). However, single rule application cannot indicate the demand for a RED car with a MOONROOF. By carefully combining the configuration mapping rules across parts, the configuration system and method can map demand data across multiple product parts.

Before describing the combination and consolidation of configuration mapping rules into a holistic rule space, a few more example dimensions in which configuration mapping rules may occur are described. Example dimensions in which configuration mapping rules may occur are (i) configuration mapping rules specific to time periods, (ii) configuration mapping rules specific to product lines and configuration mapping rules common across product lines, and (iii) configuration mapping rules with irrelevant and unnecessary features. The different dimensions can affect how configuration mapping rules of one Product Model are mapped to another Product Model.

Configuration Mapping Rules Specific To Time Periods. In at least one embodiment of ADI, the configuration mapping rules are described independently each month, but the system and method described herein analyzes the effect of the configuration mapping rules across time. The mappings may not only be changed every month, but they may also be chained. For example, a mapping rule {A->B} may be defined in month 1, but it may be changed to {A->C} in month 2 as a correction. The symbols "->" mean "maps to". Thus, {A->B} is a an example of a part-to-part mapping rule. For example, if A is the part "color = dark blue" and B is the part "color = midnight blue, then the part-to-part mapping rule {A->B} means that the part "color = dark blue" maps to the part "color = midnight blue". Another example is that part-to-part mapping rules {A->B} and {B->C} may be defined in successive months.

Configuration Mapping Rules Specific To Product Lines And Configuration Mapping Rules Common Across Product Lines. The configuration mapping rules may also be split across products, with some configuration mapping rules mapping internally to one product and some configuration mapping rules that map across products. For example, in the ADI context, each model year of a car has a set of configuration mapping rules that map old, abolished configurations to new configurations of the same model year. There are other configuration mapping rules that map configurations from a model year to the next.

Configuration Mapping Rules with Irrelevant and Unnecessary Features. The configuration mapping rules may sometimes contain some features that are irrelevant and trivial for purposes of mapping. For example, specific features may be of interest in the configuration mapping rules, and other features may not be of particular interest. An example in the ADI context is emission types, which are not used to calculate demand. In at least one embodiment, such features can be stripped from configuration mapping rules without affecting the usefulness of the configuration mapping rules.

FIG. 1 depicts a configuration rule mapping process 100 for use by the configuration mapping engine 202 of configuration rule mapping system 200. The effectiveness of configuration rule mapping can be improved by consolidating the configuration mapping rules across feature parts, time periods, and product lines. By combining, the configuration mapping rules in product model data 204 the configuration rule mapping process 100 and configuration rule mapping system 200 apply the configuration mapping rules at one time to the entire product, such as a vehicle. In the ADI context, this means producing a single set of configuration mappings that will map any configuration of an old model year car into the latest equivalent of the new model year.

Operation 102 removes unnecessary parts from the Product Model Configuration Mapping Rules. In at least one embodiment, parts are "unnecessary" when the intended use of the Product Model does not need the particular part. For example, in at least one embodiment of ADI, emission standards are not used to determine demand. Thus, in this embodiment, emission standards are not necessary and, thus, do not need to be mapped from one Product Model to another Product Model.

Operation 104 combines configuration mapping rules from a set of time periods, such as all time periods from which demand and sales data is available, and consolidates the configuration mapping rules to view the effect of the configuration mapping rules across time. Configuration mapping rules from later months override configuration mapping rules from earlier months. In at least one embodiment, operation 104 performs "rule-chaining" to see the effect of configuration mapping rules across time. For example, if two configuration mapping rules {A->B} and {B->C} exist, operation 104 chains the two configuration mapping rules to obtain both {A->C} and {B->C}, since both A and B configurations can exist, and the latest equivalent of A and B is the "C" configuration. The configuration mapping rules may be chained to any depth, and operation 104 creates configuration mapping rules that map all the configurations that can exist to the latest configuration.

Next, operation 106 consolidates configuration mapping rules across product lines to generate a partially consolidated set of configuration mapping rules for:
a. Configuration mapping rules internal to the established product;
b. Configuration mapping rules that map the established product to the new product; and
c. Configuration mapping rules internal to the new product.

The "rule-chaining" procedure described above can be used to obtain a single set of configuration mapping rules that map all product configurations from the established product to the latest configuration of the new product.

Once the time periods and product configuration mapping rules have been combined, configuration rule mapping process 100 combines the different aspects of the configuration mapping rules. This combination can be done in two steps.

Operation 108 adds the particular feature rules, such as the Color Configuration Mapping Rules, to the Product Model Configuration Mapping Rules. For each product configuration, operation 108 determines which features, such as colors, are possible on that Product Model and creates multiple configuration mapping rules so that a new set of configuration mapping rules contains both the feature rules and Product Models together. For example, if the following Color Configuration Mapping Rules exist:
C1 -> C2
C3 -> C4

Then, for the Product Model Configuration Mapping Rule E1 -> E2, operation 108 expands the configuration mapping rules to:
E1 C1 -> E2 C2
E1 C3 -> E2 C4

Since, in at least one embodiment, no explicit configuration mapping rules exist for accessories, operation 110 adds all possible accessories to each of the configuration mapping rules above to obtain complete configuration mapping rules that include color, Product Model, and accessories. If two accessories exist on the old model years A1 and A2, configuration rule mapping process 100 appends them to the configuration mapping rules. So, the latest set of configuration mapping rules are:
E1 C1 A1 -> E2 C2 A1
E1 C1 A2 -> E2 C2 A2
E1 C3 A1 -> E1 C4 A1
E1 C3 A2 -> E1 C4 A2

Operation 112 determines whether the set of rules includes irrelevant parts and features. If so, operation 114 removes the irrelevant parts and features from the set of configuration mapping rules. After removing some parts, if the left hand side of two configuration mapping rules becomes the same, then the right hand side also needs to be the same. This serves as a consistency check and a measure of the quality of the configuration mapping rules because two configurations that have trivial or small parts should not map to completely different configurations on the new product line.

Completion of operation 114 or operation 112 if the set of rules do not include irrelevant parts and features, a single set of configuration mapping rules 116 is generated that is applicable to the entire set of configurations in the established product.

In the context of ADI, configuration rule mapping process 100 applies these configuration rules to the old configurations and can map the demand and sales data 208 of the old configurations to equivalent configurations in the new product. Configuration rule mapping system 200 has now generated demand and sales information for each configuration in the new product and can store and/or distribute such information for user analysis and evaluation. The new configuration mapping data could also be used for other purposes and types of information as well, not just demand prediction.

Following is an example of Configuration Rule Mapping using ADI data for an example vehicle referred to as the "Apollo".

ADI Configuration Mapping Rules

Following are two types of example configuration mapping rules:
Product Model Configuration Mapping Rules
Color Configuration Mapping Rules Product Model Configuration Mapping Rules The format of a Product Model Configuration Mapping Rule can be represented as:
Mapping month/year, Model year + Model, Emission, Transmission, Drive Train, Part 1, Part 2 ......Part n,
->
Mapped Model year + Mapped Model, New Emission, New Transmission, New Drive Train, New Part 1, New Part 2 ......New Part m
Note: "New Part" in the mapped model may or may not be same as the part in the original model.

Example

The following example illustrates a configuration mapping within the same model year:
{[June 2005, 2005 Apollo, 50 State Emission, Automatic, 2 Wheel Drive, Splash Guards, Convenience Package, Advanced Airbag Technology]
->
[2005 Apollo, 50 State Emission, Automatic, 2 Wheel Drive, Splash Guards, Special Edition Package]}.
The following example illustrates a configuration mapping from a model year to the next model year:
{[Dec 2005, 2005 Apollo, Cal Emission, 5 speed Manual, 2 Wheel Drive, Splash Guards, Sports Package, Advanced Airbag Technology]
->
[2006 Apollo, 50 State Emission, Automatic, 2 Wheel Drive, Splash Guards, Leather Sports Package, Leather Package]}.

Color Configuration Mapping Rules

The format of a Color Configuration Mapping Rule can be represented as:
Mapping month/year, Model year + Model, Color Group, Interior Color, Exterior Color,
->
Mapped Model year + Mapped Model, Mapped Color Group, Mapped Interior Color, Mapped Exterior Color
Note: New Interior/Exterior Color in the Mapped model may or may not be same as the Color in the original model.

Example

The following example illustrates a color mapping within the same model year:
June 2005, 2005 Apollo, 1, Charcoal, Blue
->
2005 Apollo, 1, Charcoal, Majestic Blue
The following example illustrates a color mapping within the same model year:
Dec 2005, 2005 Apollo, 2, Charcoal, Blue
->
2006 Apollo, 2, Charcoal, Sheer Silver
Using the example Product Model Configuration Mapping Rules and Color Configuration Mapping Rules, the following Product Model and Color Configuration Mapping Rules are stored in memory 204:
Product Model Configuration Mapping Rule E1:
{[June 2005, 2005 Apollo, 50 State Emission, Automatic, 2 Wheel Drive, Splash Guards, Convenience Package, Advanced Airbag Technology}
->
[2005 Apollo, 50 State Emission, Automatic, 2 Wheel Drive, Splash Guards, Special Edition Package]}.
Product Model Configuration Mapping Rule E2:
{[Dec 2005 Apollo, 50 State Emission, Automatic, 2 Wheel Drive, Splash Guards, Special Edition Package}
->
[2006 Apollo, 50 State Emission, Automatic, 2 Wheel Drive, Splash Guards, Leather Sports Package, Leather Package]}.
Color Configuration Mapping Rule C1:
{[June 2005, 2005 Apollo, 1, Charcoal, Blue}
->
[2005 Apollo, 1, Charcoal, Majestic Blue]}.
Color Configuration Mapping Rule C2:
{[Dec 2005, 2005 Apollo, 2, Frost, Blue}
->
[2006 Apollo, 2, Frost, Sheer Silver]}.
Following is an example application of configuration rule mapping process 100. Operation 102 removes unnecessary parts, such as emission types, from Product Model Configuration Mapping Rules. Applying operation 102, the new Product Model Configuration Mapping Rules are:
Product Model Configuration Mapping Rule E1:
{[June 2005, 2005 Apollo, Automatic, 2 Wheel Drive, Splash Guards, Convenience Package, Advanced Airbag Technology}
->
[2005 Apollo, Automatic, 2 Wheel Drive, Splash Guards, Special Edition Package}
Product Model Configuration Mapping Rule E2:
{[Dec 2005 Apollo, Automatic, 2 Wheel Drive, Splash Guards, Special Edition Package}
->
[2006 Apollo, Automatic, 2 Wheel Drive, Splash Guards, Leather Sports Package, Leather Package]}.
Operation 104 combines configuration mapping rules from all the time periods of interest, and operation 106 consolidates the configuration mapping rules to view the effect of the configuration mapping rules across time. Applying operations 104 and 106, the LHS of Product Configuration mapping rules E1 and E2, Product Configuration mapping rules E3 and E4 are obtained:
Product Model Configuration Mapping Rule E3:
{[June 2005, 2005 Apollo, Automatic, 2 Wheel Drive, Splash Guards, Convenience Package, Advanced Airbag Technology}
->
[2006 Apollo, Automatic, 2 Wheel Drive, Splash Guards, Leather Sports Package, Leather Package]}.
Product Model Configuration Mapping Rule E4:
{[Dec 2005, 2005 Apollo, Automatic, 2 Wheel Drive, Splash Guards, Special Edition Package}

[2006 Apollo, Automatic, 2 Wheel Drive, Splash Guards, Leather Sports Package, Leather Package}

Operation 108 adds Color Configuration Mapping Rules to the Product Model Configuration Mapping Rules obtained in operation 106.

Color Configuration Mapping Rule C1
{[June 2005, 2005 Apollo, 1, Charcoal, Blue]
->
[2005 Apollo, 1, Charcoal, Majestic Blue]}.
Color Configuration Mapping Rule C2
{[Dec 2005, 2005 Apollo, 2, Frost, Blue]
->
[2006 Apollo, 2, Frost, Sheer Silver]}.

Operation 108 generates the following configuration mapping rules:
{[June 2005, 2005 Apollo, Automatic, 2 Wheel Drive, Splash Guards, Convenience Package, Advanced Airbag Technology, Charcoal, Blue]
->
[2006 Apollo, Automatic, 2 Wheel Drive, Splash Guards, Leather Sports Package, Leather Package, Charcoal, Majestic Blue]}
and
{Dec 2005, 2005 Apollo, Automatic, 2 Wheel Drive, Splash Guards, Special Edition Package]
->
[2006 Apollo, Automatic, 2 Wheel Drive, Splash Guards, Leather Sports Package, Leather Package, Frost, Sheer Silver]}.

Note: This assumes that Interior Color Charcoal and Exterior Color Blue go with the LHS of E3 and Interior Color Charcoal and Exterior Color majestic Blue goes with RHS of E3. Similarly Frost, Blue valid for LHS of E4 and Frost and Sheer Silver valid for RHS of E4

Since no explicit configuration mapping rules exist for accessories, configuration rule mapping process 100 adds all possible accessories to each of the configuration mapping rules above to obtain complete configuration mapping rules that include color, Product Model and accessories. If, for example two accessories are available on Apollo: Floor Mats and Satellite Radio, Configuration rule mapping process 100 generates the following final configuration mapping rules after including accessories:

{[June 2005, 2005 Apollo, Automatic, 2 Wheel Drive, Splash Guards, Convenience Package, Advanced Airbag Technology, Charcoal, Blue, Floor Mats]
->
[2006 Apollo, Automatic, 2 Wheel Drive, Splash Guards, Leather Sports Package, Leather Package, Charcoal, Majestic Blue, Floor Mats]}.
{[June 2005, 2005 Apollo, Automatic, 2 Wheel Drive, Splash Guards, Convenience Package, Advanced Airbag Technology, Charcoal, Blue, Satellite Radio]
->
[[2006 Apollo, Automatic, 2 Wheel Drive, Splash Guards, Leather Sports Package, Leather Package, Charcoal, Majestic Blue, Satellite Radio]}.
{Dec 2005, 2005 Apollo, Automatic, 2 Wheel Drive, Splash Guards, Special Edition Package, Floor Mats]
->
[[2006 Apollo, Automatic, 2 Wheel Drive, Splash Guards, Leather Sports Package, Leather Package, Frost, Sheer Silver, Floor Mats]}.
{[Dec 2005, 2005 Apollo, Automatic, 2 Wheel Drive, Splash Guards, Special Edition Package, Satellite Radio]
->
[2006 Apollo, Automatic, 2 Wheel Drive, Splash Guards, Leather Sports Package, Leather Package, Frost, Sheer Silver, Satellite Radio]}.

Operation 112 determines whether any unnecessary or irrelevant parts exist. If so, operation 114 removes irrelevant parts and features from the set of configuration mapping rules. For example, if the Splash Guard is an irrelevant part, operation 114 removes Splash Guard from the configuration mapping rules generated in operation 110. Upon completion of operation 114, a single set 116 of the following configuration mapping rules, applicable to the entire set of configurations, remain:

{[June 2005, 2005 Apollo, Automatic, 2 Wheel Drive, Convenience Package, Advanced Airbag Technology, Charcoal, Blue, Floor Mats]
->
[2006 Apollo, Automatic, 2 Wheel Drive, Leather Sports Package, Leather Package, Charcoal, Majestic Blue, Floor Mats]}.
{[June 2005, 2005 Apollo, Automatic, 2 Wheel Drive, Convenience Package, Advanced Airbag Technology, Charcoal, Blue, Satellite Radio]
->
[2006 Apollo, Automatic, 2 Wheel Drive, Leather Sports Package, Leather Package, Charcoal, Majestic Blue, Satellite Radio]}.
{[Dec 2005, 2005 Apollo, Automatic, 2 Wheel Drive, Special Edition Package, Floor Mats]
->
[2006 Apollo, Automatic, 2 Wheel Drive, Leather Sports Package, Leather Package, Frost, Sheer Silver, Floor Mats]}.
{[Dec 2005, 2005 Apollo, Automatic, 2 Wheel Drive, Special Edition Package, Satellite Radio]
->
[2006 Apollo, Automatic, 2 Wheel Drive, Leather Sports Package, Leather Package, Frost, Sheer Silver, Satellite Radio]}.

Configuration mapping can be applied to product demand problems. For example, ADI allows demand to be determined based on features of a configurable product. By performing the configuration mapping process 100, old demand data can be used to determine demand for new product configurations.

As, for example, described in Karipides I, demand for a new product offering can be estimated by studying the demand for the product's constituent features when the features occur as a part of established products. The demand and sales data in ADI database 206 can be "sliced" e.g. arranged, in various ways so that configuration rule mapping process 100 can identify the metrics for any combination of "dimensions" to allow correlating demand data with mapped configurations. For example, if a car has 3 dimensions: Trim, Color, and Moonroof, and if Trim can contain "2.5 S", "3.5 S" and "3.5 SE":

Color can contain "Black", "Blue" or "Red"

Moonroof can contain "Moonroof" or "No Moonroof"

In at least one embodiment, the database 204 is structured in such a way that the metrics for all vehicles are stored at the end-configuration level, and metrics for features or feature combinations are calculated from the end-configuration level. Table 1 depicts example demand and sales for selected end-configurations:

TABLE 1

| Trim | Color | Moonroof | Sales | DemandScore |
| --- | --- | --- | --- | --- |
| 2.5 S | Black | Moonroof | 1 | 30 |
| 2.5 S | Blue | Moonroof | 2 | 40 |
| 2.5 S | Blue | No Moonroof | 1 | 30 |
| 3.5 S | Red | No Moonroof | 2 | 50 |
| 3.5 S | Black | Moonroof | 3 | 40 |
| 3.5 SE | Blue | Moonroof | 1 | 30 |

Calculation of metrics. To determine how many cars were sold with Black color, sum up the "Sales" column for all rows with "Black" in the Color column of Table 1. In this example, the number of Black cars sold is 4, i.e. 1 + 3 = 4. To get the "mix", divide the number of Black cars by total sales. (Total = 10). The mix in this example is 40%, i.e. 4 / 10 = 40%.

The same methodology using the demand score is used to obtain the demand percentage of 2.5 S:

Demand Score of all rows containing 2.5S = 30 + 40 + 30 = 100.

Total Demand Score = 30 + 40 + 30 + 50 + 40 + 30 = 220.

Therefore, the Demand percentage of 2.5 S = 100 / 220 = 45.45%.

To obtain the demand mix % of Moonroof on 2.5 S:

Demand score of rows with Moonroof that also have Trim 2.5 S = 30 + 40 = 70.

Total Demand Score of rows with a Trim of 2.5 S = 30 + 40 + 30 = 100.

Therefore, the Demand mix percentage of a Moonroof with Trim 2.5 S = 70/100 = 70%.

Configuration mapping preserves the "sliceability" property of the ADI database. The end effect of the rule consolidation process is to produce mappings of end configurations. Table 2 includes a final set of configuration mapping rules obtained after completing all the steps in the configuration mapping process 100, i.e. the black and blue colors were merged into "Metallic Black" in 2006 Apollo, the "3.5 S" trim was renamed to "3.5 Super-edition", and the Moonroof remained unchanged.

TABLE 2

| 2005 Apollo | Maps To | 2006 Apollo |
| --- | --- | --- |
| 2.5 S, Black, Moonroof | -> | 2.5 S, Metallic Black, Moonroof |
| 2.5 S, Blue, Moonroof | -> | 2.5 S, Metallic Black, Moonroof |
| 2.5 S, Red, Moonroof | -> | 2.5 S, Red, Moonroof |
| 3.5 S, Black, No Moonroof | -> | 3.5 Super-edition, Metallic Black, No Moonroof |
| 3.5 SE, Red, No Moonroof | -> | 3.5 SE, Red, No Moonroof |
| Etc... | | |

Configuration rule mapping process 100 can apply the configuration mapping rules from "Table 2" to the ADI database (Table 1), the new Table 3 is:

TABLE 3

| Trim | Color | Moonroof | Sales | Demand Score |
| --- | --- | --- | --- | --- |
| 2.5 S | Metallic Black | Moonroof | 1 | 30 |
| 2.5 S | Metallic Black | Moonroof | 2 | 40 |
| 2.5 S | Metallic Black | No Moonroof | 1 | 30 |
| 3.5 Super-edition | Red | No Moonroof | 2 | 50 |
| 3.5 Super-edition | Metallic Black | Moonroof | 3 | 40 |
| 3.5 SE | Metallic Black | Moonroof | 1 | 30 |

The demand mix can now be computed using the consolidated model data. Determining the sales of "Metallic Black" yields 8, i.e. 8 = 1 + 2 + 1 + 3 + 1. The Total Cars sold is 10, 10 = 1 + 2 + 1 + 2 + 3 + 1. Therefore, the sales mix of "Metallic Black" equals 8/10 = 80%. Similarly, the demand mix percentage of "Metallic Black" equals 77%, i.e. [(30 + 40 + 30 + 40 + 30)/Total(DemandScore)] = 170 / 220 = 77%. Accordingly, the demand mix percentage of a new color ("Metallic Black"=77%) can be calculated based on data of old configurations (configurations with "Black" and "Blue") through the rule-consolidation process.

Figure 3:
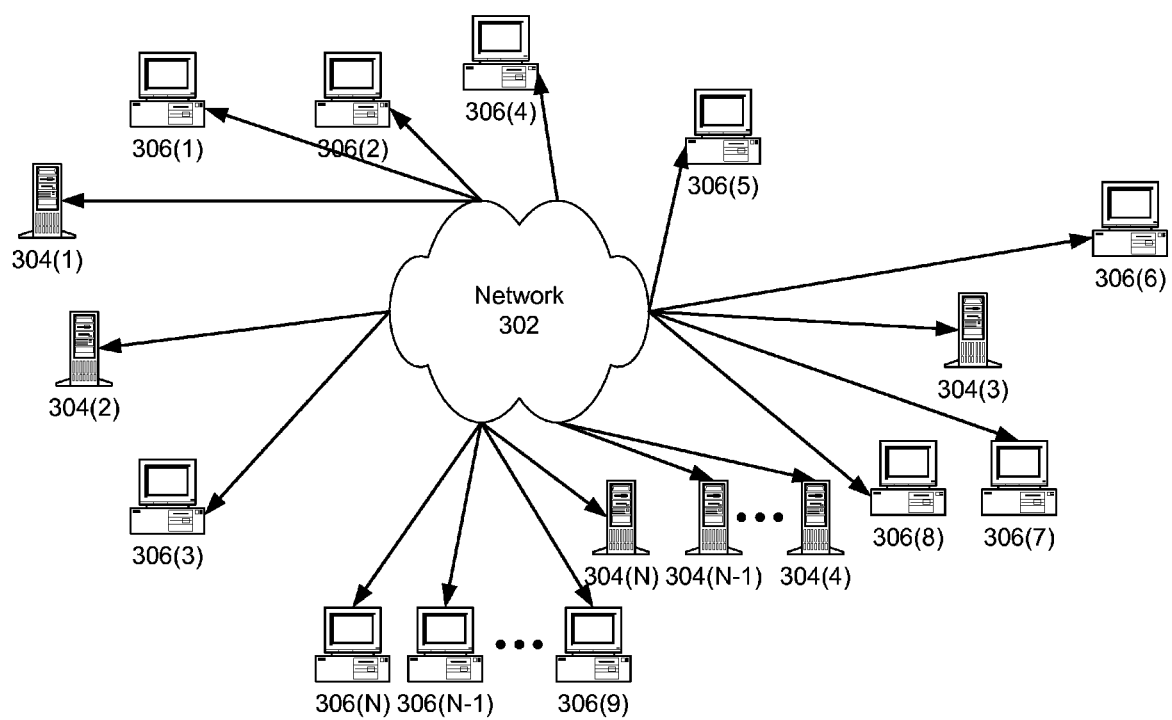
FIG. 3 depicts a network environment in which the system and process of FIGS. 1 and 2 may be practiced.

FIG. 3 is a block diagram illustrating a network environment in which configuration rule mapping process 100 and configuration rule mapping system 200 may be practiced. Network 302 (e.g. a private wide area network (WAN) or the Internet) includes a number of networked server computer systems 304(1)-(N) that are accessible by client computer systems 306(1)-(N), where N is the number of server computer systems connected to the network. Communication between client computer systems 306(1)-(N) and server computer systems 304(1)-(N) typically occurs over a network, such as a public switched telephone network over asynchronous digital subscriber line (ADSL) telephone lines or high-bandwidth trunks, for example communications channels providing T1 or OC3 service. Client computer systems 306(1)-(N) typically access server computer systems 304(1)-(N) through a service provider such as an Internet service provider by executing application specific software, commonly referred to as a browser, on one of client computer systems 306(1)-(N).

Client computer systems 306(1)-(N) and/or server computer systems 304(1)-(N) may be, for example, computer systems of any appropriate design, including a mainframe, a mini-computer, a personal computer system, or a wireless, mobile computing device. These computer systems are typically information handling systems, which are designed to provide computing power to one or more users, either locally or remotely. Such a computer system may also include one or a plurality of input/output ("I/O") devices coupled to the system processor to perform specialized functions. Mass storage devices such as hard disks, CD-ROM drives and magneto-optical drives may also be provided, either as an integrated or peripheral device. One such example computer system is shown in detail in FIG. 4.

Figure 4:
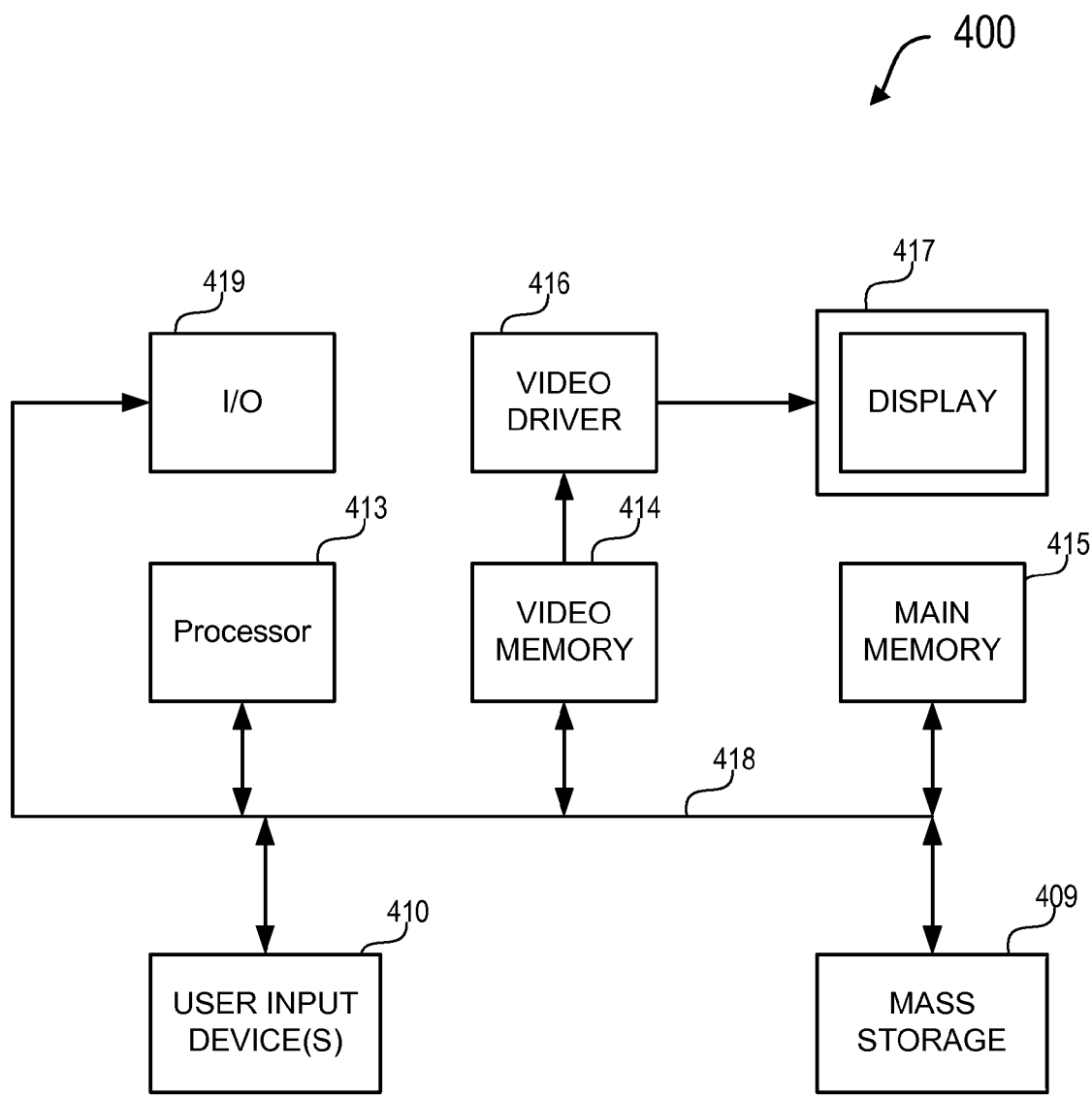
FIG. 4 illustrates a general purpose computer system.

Embodiments of the configuration rule mapping process 100 and configuration rule mapping system 200 can be implemented using software processing engine executable using a processor in a computer system such as a general-purpose computer 400 illustrated in FIG. 4. Input user device(s) 410, such as a keyboard and/or mouse, are coupled to a bi-directional system bus 418. The input user device(s) 410 are for introducing user input to the computer system and communicating that user input to processor 413. The computer system of FIG. 4 also includes a video memory 414, main memory 415 and mass storage 409, all coupled to bi-directional system bus 418 along with input user device(s) 410 and processor 413. The mass storage 409 may include both fixed and removable media, such as other available mass storage technology. Bus 418 may contain, for example, 32 address lines for addressing video memory 414 or main memory 415. The system bus 418 also includes, for example, an n-bit DATA bus for transferring DATA between and among the components, such as CPU 409, main memory 415, video memory 414 and mass storage 409, where "n" is, for example, 32 or 64. Alternatively, multiplex DATA/address lines may be used instead of separate DATA and address lines.

I/O device(s) 419 may provide connections to peripheral devices, such as a printer, and may also provide a direct connection to a remote server computer systems via a telephone link or to the Internet via an internet service provider (ISP). I/O device(s) 419 may also include a network interface device to provide a direct connection to a remote server computer systems via a direct network link to the Internet via a POP (point of presence). Such connection may be made using, for example, wireless techniques, including digital cellular telephone connection, Cellular Digital Packet Data (CDPD) connection, digital satellite data connection or the like. Examples of I/O devices include modems, sound and video devices, and specialized communication devices such as the aforementioned network interface.

Computer programs and data are generally stored as instructions and data in mass storage 409 until loaded into main memory 415 for execution. Computer programs may also be in the form of electronic signals modulated in accordance with the computer program and data communication technology when transferred via a network. The method and functions relating to configuration rule mapping process 100 and configuration rule mapping system 200 may be implemented in a computer program alone or in conjunction other hardware.

The processor 413, in one embodiment, is a microprocessor manufactured by Motorola or Intel. However, any other suitable single or multiple microprocessors or microcomputers may be utilized. Main memory 415 is comprised of dynamic random access memory (DRAM). Video memory 414 is a dual-ported video random access memory. One port of the video memory 414 is coupled to video amplifier 416. The video amplifier 416 is used to drive the display 417. Video amplifier 416 is well known in the art and may be implemented by any suitable means. This circuitry converts pixel DATA stored in video memory 414 to a raster signal suitable for use by display 417. Display 417 is a type of monitor suitable for displaying graphic images.

The computer system described above is for purposes of example only. The configuration rule mapping process 100 and configuration rule mapping system 200 may be implemented in any type of computer system or programming or processing environment. It is contemplated that the configuration rule mapping process 100 and configuration rule mapping system 200 can be run on a stand-alone computer system, such as the one described above. The configuration rule mapping process 100 and configuration rule mapping system 200 might also be run from a server computer systems system that can be accessed by a plurality of client computer systems interconnected over an intranet network. Finally, the configuration rule mapping process 100 and configuration rule mapping system 200 may be run from one or more server computer systems that are accessible to clients over the Internet.

Many embodiments of the present invention have application to a wide range of industries including the following: computer hardware and software manufacturing and sales, professional services, financial services, automotive sales and manufacturing, telecommunications sales and manufacturing, medical and pharmaceutical sales and manufacturing, and construction industries.

Although the present invention has been described in detail, it should be understood that various changes, substitutions and alterations can be made hereto without departing from the spirit and scope of the invention.

What is claimed is:

1. A method of using a computer system to map a first set of configuration rules to a second set of configuration rules, the method comprising:
   accessing, from a first memory, multiple, part-to-part mapping rules;
   combining the multiple, part-to-part mapping rules into a consolidated configuration mapping rule that maps parts in the first set of configuration rules to parts in the second set of configuration rules, wherein the first set of configuration rules includes a first configuration rule and the second set of configuration rules includes a second configuration rule, and each configuration mapping rule includes a set of parts of a product;
   storing the consolidated configuration mapping rule in a second memory; and
   applying the consolidated configuration mapping rule by a processing engine to produce mappings of end configurations of the product associated with the consolidated configuration mapping rule and compute demand of feature mixes of the products.

2. The method of claim 1 further comprising:
   correlating predetermined data associated with the first configuration rule to the second configuration rule using the consolidated mapping rule to generate correlated data to allow use of the predetermined data with a product configured in accordance with at least the second configuration rule; and
   making the correlated data available to a computer system user.

3. The method of claim 2 wherein the predetermined data includes product demand for a product represented by the first configuration rule.

4. The method of claim 1 further comprising:
   chaining a first part-to-part mapping rule to a second part-to-part mapping rule to generate a third part-to-part mapping rule, wherein the multiple, part-to-part mapping rules combined into the consolidated configuration mapping rule include the third part-to-part mapping rule.

5. The method of claim 1 wherein combining the multiple, part-to-part mapping rules into a consolidated configuration mapping rule further comprises:
   combining the multiple, part-to-part mapping rules from multiple time periods into the consolidated configuration mapping rule.

6. The method of claim 1 further comprising:
   combining the multiple, part-to-part mapping rules into multiple consolidated configuration mapping rules that map multiple configuration rules in the first set of configuration rules to multiple configuration rules in the second set of configuration rules; and
   storing the consolidated configuration mapping rules in the second memory.

7. The method of claim 1 further comprising:
   providing the consolidated configuration mapping rule for display on a monitor.

8. The method of claim 1 wherein the product features comprise product features or one or more vehicles and each configuration rule includes a plurality of parts and at least one relationship between the parts in the configuration rule.

9. The method of claim 1 further comprising:
   removing at least one part from the first configuration rule prior to combining the multiple, part-to-part mapping rules.

10. The method of claim 1 wherein the first memory is the second memory.

11. The method of claim 1 wherein applying the consolidated configuration mapping rule by a processing engine to produce mappings of end configurations of the product associated with the consolidated configuration mapping rule and compute demand of feature mixes of the products comprises:
applying the consolidated configuration mapping rule by a product processing engine to produce mappings of end configurations of the product associated with the consolidated configuration mapping rule, generate a configuration of the product associated with the consolidated configuration mapping rule, and compute demand of feature mixes of the products.

12. The method of claim 1 wherein applying the consolidated configuration mapping rule by a processing engine to produce mappings of end configurations of the product associated with the consolidated configuration mapping rule and compute demand of feature mixes of the products comprises:
applying the consolidated configuration mapping rule by a product processing engine to produce mappings of end configurations of the product associated with the consolidated configuration mapping rule, generate a configuration of the product associated with the consolidated configuration mapping rule, compute demand of feature mixes of the products, and generate a correlation of demand data for at least the product associated with a first model with a second model.

13. The method of claim 12 wherein the first and second models are each a member of a group consisting of: (1) a product model and (2) a configuration model.

14. The method of claim 1 further comprising:
when the data processing system executes code, the code causes the data processing system to perform:
chaining a first part-to-part mapping rule to a second part-to-part mapping rule to generate a third part-to-part mapping rule, wherein the multiple, part-to-part mapping rules combined into the consolidated configuration mapping rule include the third part-to-part mapping rule.

15. The method of claim 1 wherein combining the multiple, part-to-part mapping rules into a consolidated configuration mapping rule further comprises:
combining the multiple, part-to-part mapping rules from multiple time periods into the consolidated configuration mapping rule.

16. The method of claim 1 further comprising:
when the data processing system executes code, the code causes the data processing system to perform:
combining the multiple, part-to-part mapping rules into multiple consolidated configuration mapping rules that map multiple configuration rules in the first set of configuration rules to multiple configuration rules in the second set of configuration rules; and
storing the consolidated configuration mapping rules in the second memory.

17. The method of claim 1 further comprising:
when the data processing system executes code, the code causes the data processing system to perform:
providing the consolidated configuration mapping rule for display on a monitor.

18. The method of claim 1 wherein the product features comprise product features or one or more vehicles and each configuration rule includes a plurality of parts and at least one relationship between the parts in the configuration rule.

19. The method of claim 1 further comprising:
when the data processing system executes code, the code causes the data processing system to perform:
removing at least one part from the first configuration rule prior to combining the multiple, part-to-part mapping rules.

20. The method of claim 1 wherein the first memory is the second memory.

21. The method of claim 1 wherein applying the consolidated configuration mapping rule by a processing engine to produce mappings of end configurations of the product associated with the consolidated configuration mapping rule and compute demand of feature mixes of the products comprises:
applying the consolidated configuration mapping rule by a product processing engine to produce mappings of end configurations of the product associated with the consolidated configuration mapping rule, generate a configuration of the product associated with the consolidated configuration mapping rule, and compute demand of feature mixes of the products.

22. The method of claim 1 wherein applying the consolidated configuration mapping rule by a processing engine to produce mappings of end configurations of the product associated with the consolidated configuration mapping rule and compute demand of feature mixes of the products comprises:
applying the consolidated configuration mapping rule by a product processing engine to produce mappings of end configurations of the product associated with the consolidated configuration mapping rule, generate a configuration of the product associated with the consolidated configuration mapping rule, compute demand of feature mixes of the products, and generate a correlation of demand data for at least the product associated with a first model with a second model.

23. The method of claim 22 wherein the first and second models are each a member of a group consisting of: (1) a product model and (2) a configuration model.

24. A method comprising:
receiving, with a computer system, a demand of feature mixes of the products from a data processing system that maps a first set of configuration rules to a second set of configuration rules, wherein when the data processing system executes code, the code causes the data processing system to perform:
accessing, from a first memory, multiple, part-to-part mapping rules;
combining the multiple, part-to-part mapping rules into a consolidated configuration mapping rule that maps parts in the first set of configuration rules to parts in the second set of configuration rules, wherein the first set of configuration rules includes a first configuration rule and the second set of configuration rules includes a second configuration rule, and each configuration mapping rule includes a set of parts of a product;
storing the consolidated configuration mapping rule in a second memory;
applying the consolidated configuration mapping rule by a processing engine to produce mappings of end configurations of the product associated with the consolidated configuration mapping rule and compute demand of feature mixes of the products; and
provide the demand of feature mixes of the products to the computer system.

25. The method of claim 24 further comprising:
when the data processing system executes code, the code causes the data processing system to perform:
correlating predetermined data associated with the first configuration rule to the second configuration rule using the consolidated mapping rule to generate correlated data to allow use of the predetermined data with a product configured in accordance with at least the second configuration rule; and making the correlated data available to a computer system user.

26. The method of claim 25 wherein the predetermined data includes product demand for a product represented by the first configuration rule.

* * * * *